(12) United States Patent
Yoo

(10) Patent No.: US 10,468,353 B2
(45) Date of Patent: Nov. 5, 2019

(54) SEMICONDUCTOR PACKAGES AND METHODS OF FABRICATING THE SAME

(71) Applicant: SAMSUNG ELECTRONICS CO., LTD., Suwon-si, Gyeonggi-do (KR)

(72) Inventor: JaeWook Yoo, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 161 days.

(21) Appl. No.: 15/499,353

(22) Filed: Apr. 27, 2017

(65) Prior Publication Data

US 2018/0068956 A1 Mar. 8, 2018

(30) Foreign Application Priority Data

Sep. 7, 2016 (KR) .................. 10-2016-0115240

(51) Int. Cl.
| | |
|---|---|
| *H05K 7/00* | (2006.01) |
| *H01L 23/552* | (2006.01) |
| *H01L 21/02* | (2006.01) |
| *H01L 21/48* | (2006.01) |
| *H01L 21/56* | (2006.01) |
| *H01L 23/31* | (2006.01) |
| *H01L 23/00* | (2006.01) |
| *H01L 25/065* | (2006.01) |

(52) U.S. Cl.
CPC ...... *H01L 23/552* (2013.01); *H01L 21/02068* (2013.01); *H01L 21/4817* (2013.01); *H01L 21/563* (2013.01); *H01L 23/3128* (2013.01); *H01L 24/09* (2013.01); *H01L 24/11* (2013.01); *H01L 24/14* (2013.01); *H01L 24/49* (2013.01); *H01L 25/0655* (2013.01); *H01L 2224/0401* (2013.01); *H01L 2224/04042* (2013.01); *H01L 2224/48091* (2013.01)

(58) Field of Classification Search
None
See application file for complete search history.

(56) References Cited

U.S. PATENT DOCUMENTS

| | | | |
|---|---|---|---|
| 8,156,644 B2 | 4/2012 | Babb et al. | |
| 8,963,268 B2 | 2/2015 | Kim et al. | |
| 2011/0156225 A1 | 6/2011 | Hozoji et al. | |
| 2011/0221046 A1 | 9/2011 | Xiao | |
| 2011/0298111 A1 | 12/2011 | Kim | |
| 2012/0300412 A1* | 11/2012 | Song | H01L 23/552 361/728 |

(Continued)

FOREIGN PATENT DOCUMENTS

| | | |
|---|---|---|
| JP | 2005-0276981 A | 10/2005 |
| KR | 20-2000-0020585 U | 12/2000 |

(Continued)

*Primary Examiner* — Ali Naraghi
(74) *Attorney, Agent, or Firm* — Lee & Morse, P.C.

(57) ABSTRACT

A semiconductor package and a method of fabricating the same, the method including mounting semiconductor chips on a substrate; forming a mold layer that covers the semiconductor chips on the substrate; forming external terminals on a bottom surface of the substrate; forming a separation layer on the external terminals and the bottom surface of the substrate; cutting the substrate and the mold layer to separate the semiconductor chips from each other; and forming a shield surrounding the mold layer and a side surface of the substrate.

14 Claims, 10 Drawing Sheets

(56) References Cited

U.S. PATENT DOCUMENTS

| | | | | |
|---|---|---|---|---|
| 2013/0043568 A1* | 2/2013 | Song | ............... | H01L 23/552 257/659 |
| 2013/0214396 A1* | 8/2013 | Kim | ............... | H01L 23/552 257/659 |
| 2014/0262475 A1* | 9/2014 | Liu | ............... | H01L 23/5389 174/377 |
| 2015/0179588 A1* | 6/2015 | Choi | ............... | H01L 25/0657 257/659 |

FOREIGN PATENT DOCUMENTS

| | | | |
|---|---|---|---|
| KR | 10-1247343 | B1 | 3/2013 |
| KR | 10-1479248 | B1 | 1/2015 |
| KR | 10-1614721 | B1 | 4/2016 |
| KR | 10-1629634 | B1 | 6/2016 |

* cited by examiner

SEMICONDUCTOR PACKAGES AND METHODS OF FABRICATING THE SAME

CROSS-REFERENCE TO RELATED APPLICATION

Korean Patent Application No. 10-2016-0115240, filed on Sep. 7, 2016, in the Korean Intellectual Property Office, and entitled: "Semiconductor Packages and Methods of Fabricating the Same," is incorporated by reference herein in its entirety.

BACKGROUND

1. Field

Embodiments relate to a semiconductor package and a method of fabricating the same.

2. Description of the Related Art

For many kinds of electronic products, electric waves may be emitted from some semiconductor packages

SUMMARY

Embodiments are directed to a semiconductor package and a method of fabricating the same.

The embodiments may be realized by providing a method of fabricating a semiconductor package, the method including mounting semiconductor chips on a substrate; forming a mold layer that covers the semiconductor chips on the substrate; forming external terminals on a bottom surface of the substrate; forming a separation layer on the external terminals and the bottom surface of the substrate; cutting the substrate and the mold layer to separate the semiconductor chips from each other; and forming a shield surrounding the mold layer and a side surface of the substrate.

The embodiments may be realized by providing a semiconductor package including a substrate including an external terminal on a bottom surface thereof; a semiconductor chip mounted on a top surface of the substrate; a mold layer covering the semiconductor chip and the top surface of the substrate; a shield covering a top surface of the mold layer, a side surface of the mold layer, and a side surface of the substrate; and a separation layer on the bottom surface of the substrate.

The embodiments may be realized by providing a method of fabricating a semiconductor package, the method including mounting a semiconductor chip on a substrate; forming a mold layer that covers the semiconductor chip on the substrate; forming external terminals on a bottom surface of the substrate; forming a separation layer on an outer edge of the bottom surface of the substrate; and forming an electromagnetic interference shield such that the electromagnetic interference shield covers the mold layer and a side surface of the substrate.

BRIEF DESCRIPTION OF THE DRAWINGS

Features will be apparent to those of skill in the art by describing in detail exemplary embodiments with reference to the attached drawings in which.

DETAILED DESCRIPTION

It will be herein described about a semiconductor package according to an embodiment with reference to accompanying drawings.

Figure 1:
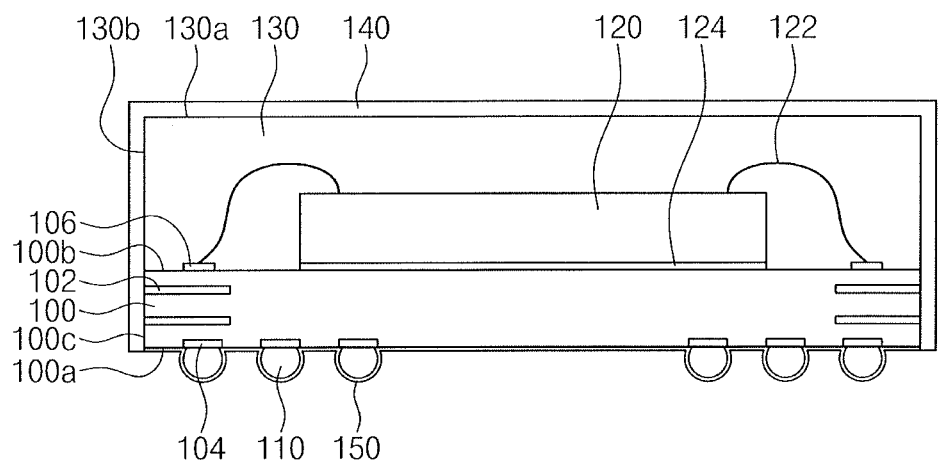
FIGS. 1 and 2 illustrate cross-sectional views of a semiconductor package according to exemplary embodiments.
Figure 2:
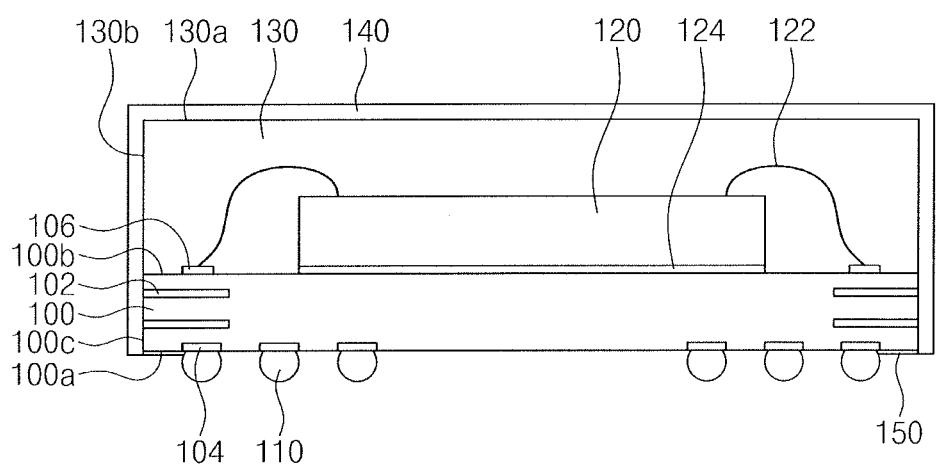

FIGS. 1 and 2 illustrate cross-sectional views for explaining a semiconductor package according to exemplary embodiments.

Referring to FIG. 1, a semiconductor package 10 according to exemplary embodiments may include, e.g., a substrate 100, an external terminal 110, a semiconductor chip 120, a mold layer 30, a shield 140, and a separation layer 150.

The substrate 100 may be provided. The substrate 100 may include a bottom surface 100a, a top surface 100b facing or opposite to the bottom surface 100a, and a side surface 100c that connects the bottom and top surfaces 100a and 100b with each other. The substrate 100 may include, e.g., a printed circuit board (PCB) or a semiconductor substrate.

The substrate 100 may include one or more ground patterns 102. The ground patterns 102 may be embedded in the substrate 100. The ground patterns 102 may be exposed through or at the side surface 100c of the substrate 100.

A plurality of external terminals 110 may be disposed below the substrate 100. For example, the external terminals 110 may be disposed on terminal pads 104 that are disposed on the bottom surface 100a of the substrate 100. One or more of the external terminals 110 may be electrically connected to the ground patterns 102.

The semiconductor chip 120 may be disposed on the substrate 100. The semiconductor chip 120 and the substrate 100 may be electrically connected to each other through bonding wires 122 and chip pads 106 disposed on the top surface 100a of the substrate 100. The semiconductor chip 120 may be electrically connected to the external terminals 110. In an implementation, as shown in FIG. 1, one semiconductor chip 120 may be provided, or the semiconductor chip 120 may be provided in plural. The semiconductor chip 120 may be, e.g., a logic chip, a memory chip, or a combination thereof. In an implementation, the semiconductor chip 120 may be mounted in a wire bonding manner. In an implementation, the semiconductor chip 120 may be mounted in a flip-chip bonding manner or other various manners. An adhesive layer 124 may be interposed between the semiconductor chip 120 and the substrate 100. For example, the adhesive layer 124 may include a die attach film (DAF). The semiconductor chip 120 may be adhered to the top surface 100b of the substrate 100 through the adhesive layer 124.

The mold layer 130 may be disposed on the semiconductor chip 120. For example, the mold layer 130 may encapsulate the semiconductor chip 120 and the bonding wires 122. The mold layer 130 may cover the semiconductor chip 120 and the top surface 100b of the substrate 100. The mold layer 130 may include an insulating polymer material. For example, the mold layer 130 may include an epoxy molding compound (EMC).

The shield 140 may be disposed on the mold layer 130. The shield 140 may cover a top surface 130a of the mold layer 130, a side surface 130b of the mold layer 130, and the side surface 100c of the substrate 100. The shield 140 may be in contact with the ground patterns 102. The shield 140 may have a lowermost surface whose level is the same as or lower than that of the bottom surface 100a of the substrate 100. The shield 140 may include a conductive material such as metal.

The shield 140 may shelter or shield the semiconductor chip 10 from an electromagnetic wave that is externally applied thereto and/or block an electromagnetic wave emitted from the semiconductor package 10. The shield 140 may be grounded through the ground patterns 102. An electromagnetic wave may be absorbed by the shield 140 and may be discharged through the ground patterns 102.

The separation layer 150 may be disposed on the bottom surface 100a of the substrate 100. For example, the separation layer 150 may cover the external terminals 110 and the bottom surface 100a of the substrate 100. For example, the separation layer 150 may conformally cover the external terminals 110 and the bottom surface 100a of the substrate 100. The separation layer 150 may have a thickness of, e.g., about 1 nm to about 10 nm. The separation layer 150 may have a bottom surface whose level is the same as that of the lowermost surface of the shield 140 (e.g., where the separation layer 150 and the shield 140 meet). The bottom surface of the separation layer 150 may be coplanar with the lowermost surface of the shield 140 (e.g., where the separation layer 150 and the shield 140 meet). In an implementation, the separation layer 150 may include, e.g., a carbon fluoride ($CF_x$). For example, the carbon fluoride of the separation layer 150 may include tetrafluoroethylene or carbon trifluoride. In an implementation, as shown in FIG. 1, the separation layer 150 may cover the external terminals 110 and the bottom surface 100a of the substrate 100. In an implementation, as shown in FIG. 2, the separation layer 150 may only partially cover the bottom surface 100a of the substrate 100. For example, the separation layer 150 may expose the external terminals 110 and a central portion of the bottom surface 100a of the substrate 100. For example, the separation layer 150 may overlap only an edge portion of the bottom surface 100a of the substrate 100.

It will be described hereinafter about a method of fabricating the semiconductor package 10 with reference to the accompanying drawings. Hereinafter, for brevity of the description, components the same as those discussed with reference to FIGS. 1 and 2 are allocated the same reference numerals thereto, and a repetitive explanation thereof may be omitted or abridged.

FIGS. 3 to 8 illustrate cross-sectional views of stages in a method of fabricating a semiconductor package according to exemplary embodiments. FIG. 9 illustrates a plan view showing patterning of a separation layer. FIGS. 10 to 13 illustrate cross-sectional views of stages in a method of fabricating a semiconductor package according to exemplary embodiments.

Figure 3:
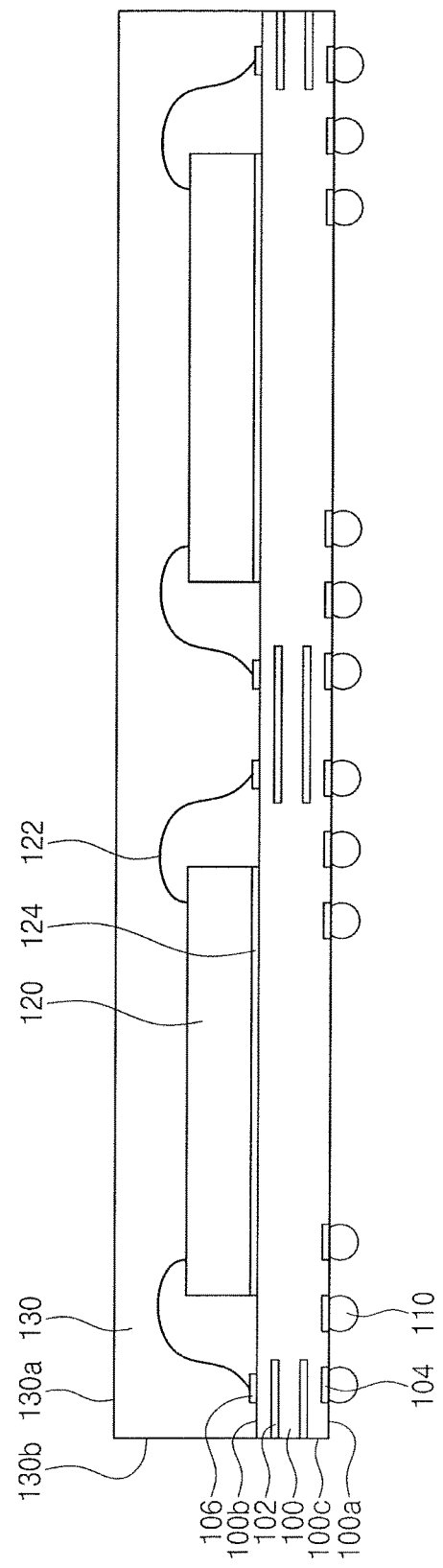
FIGS. 3 to 8 illustrate cross-sectional views of stages in a method of fabricating a semiconductor package according to exemplary embodiments.

Referring to FIG. 3, a substrate 100 may be provided. The substrate 100 may be a strip type substrate. The substrate 100 may include ground pattern 102 embedded therein.

A plurality of semiconductor chips 120 may be mounted on the substrate 100. For example, the semiconductor chips 120 may be mounted on the substrate 100 through bonding wires 122. The semiconductor chips 120 may be spaced apart from each other. As viewed in a plan view, the semiconductor chips 120 may be disposed between the ground patterns 102.

A mold layer 130 may be formed on the semiconductor chips 120. The mold layer 130 may cover the semiconductor chips 120 and a top surface 100b of the substrate 100. For example, the mold layer 130 may be formed by a mold under fill (MUF) process. The mold layer 130 may include an epoxy molding compound (EMC).

External terminals 110 may be formed below the substrate 100. For example, the external terminals 110 may be adhered on terminal pads 104 disposed on a bottom surface 100a of the substrate 100. In an implementation, the external terminals 110 may include solder balls or solder bumps.

Figure 4:
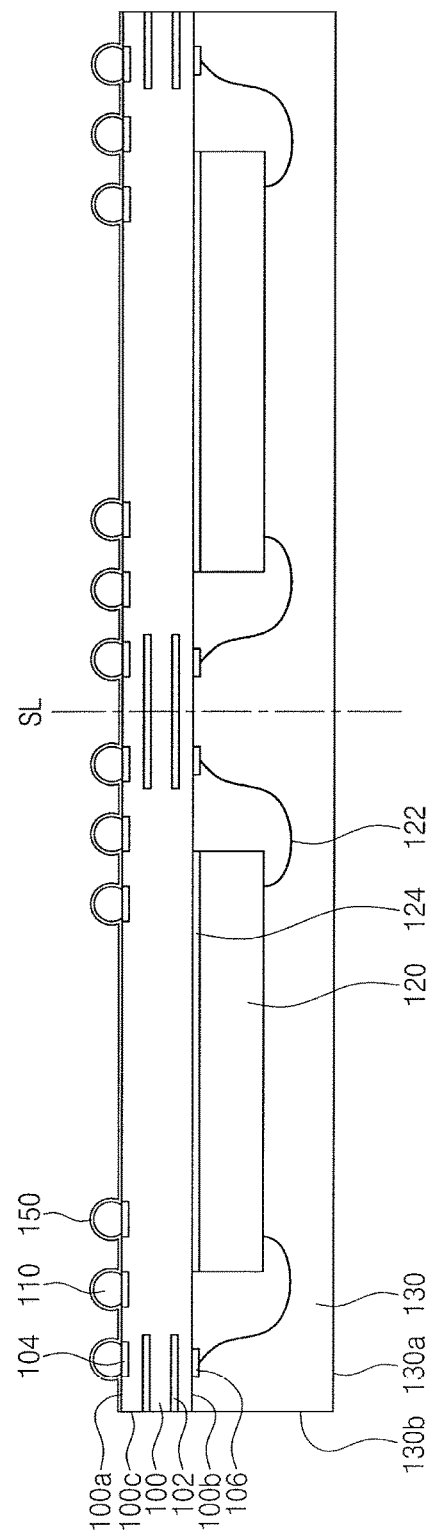

Referring to FIG. 4, a separation layer 150 may be formed below the substrate 100. The separation layer 150 may be coated to cover the external terminals 110 and the bottom surface 100a of the substrate 100. For example, the separation layer 150 may be formed using an organic layer coating process such a plasma coating process or a spray coating process. In an implementation, the separation layer 150 may include, e.g., a carbon fluoride ($CF_x$).

Figure 5:
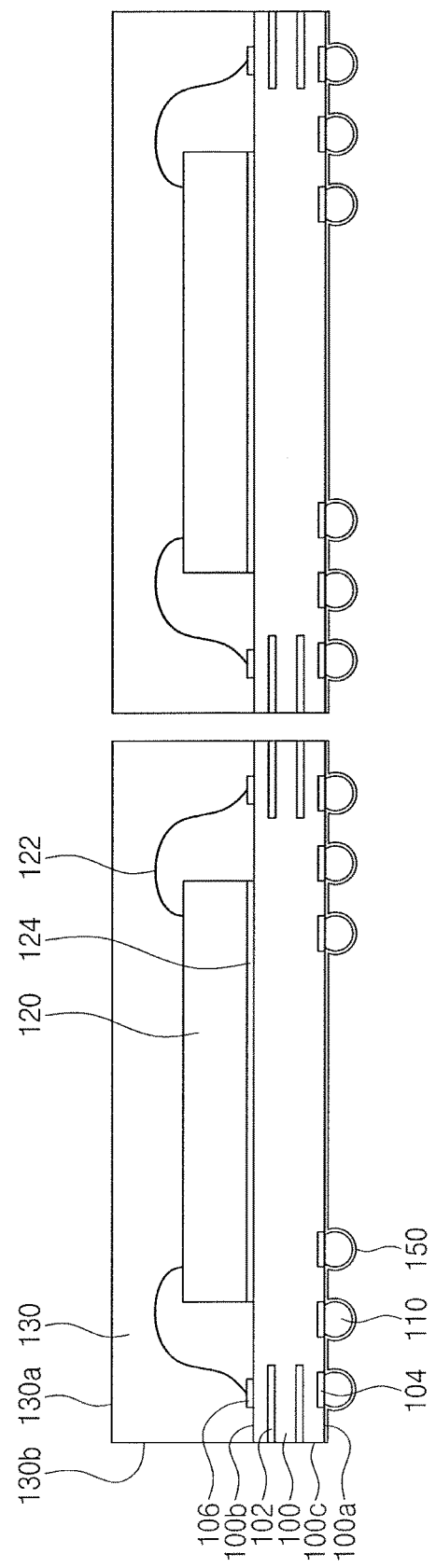

Referring to FIG. 5, the substrate 100 and the mold layer 130 may be cut. A singulation process may be performed on the substrate 100 and the mold layer 130. For example, the substrate 100 and the mold layer 130 may be singulated, or diced, through a blade sawing process or a laser sawing process performed along a sawing line SL. The sawing line SL may be between the semiconductor chips 120. For example, the singulation process may form a cutting surface between the semiconductor chips 120. The cutting of the substrate 100 and the mold layer 130 may separate the semiconductor chips 120 from each other. The singulation process may also cut the ground patterns 102. The cut ground patterns 102 may have a side surface, which is exposed through or at a side surface 100c of the cut substrate 100 that has experienced or undergone the singulation process.

Figure 6:
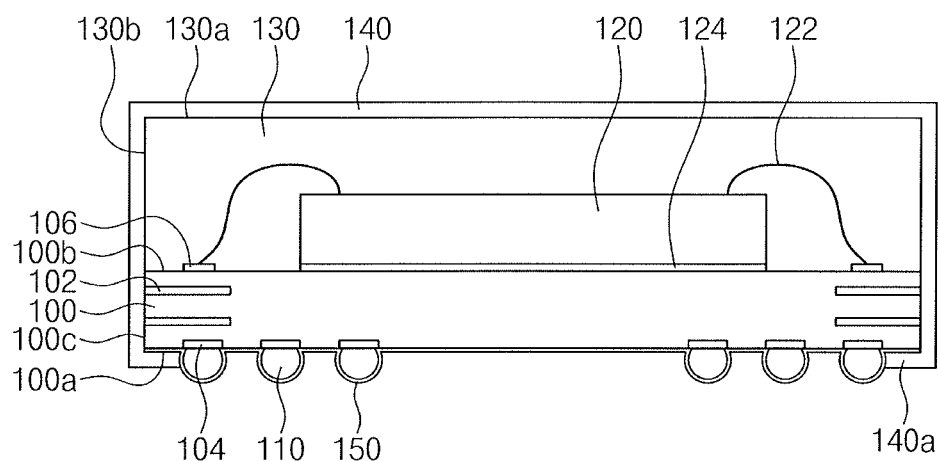

Referring to FIG. 6, a shield 140 may be formed on the mold layer 130. The shield 140 may be formed by depositing a conductive material on a top surface 130a of the mold layer 130, a side surface 130b of the mold layer 130, and the side surface 100c of the substrate 100. For example, the shield 140 may be formed by a sputtering process. In an implementation, the shield 140 may be formed by a plating process such as an electroplating or an electro-less plating. In an implementation, the conductive material may include a metal.

In an implementation, the shield 140 may have a distal end portion 140a partially covering the bottom surface 100a of the substrate 100. For example, the conductive material may overflow onto an edge portion of the bottom surface 100a of the substrate 100. This overflow could induce an electrical short between the external terminals 110. If an amount of deposition were to be controlled such that the conductive material does not overflow onto the bottom surface 100a of the substrate 100, the conductive material might not completely cover the side surface 100c of the substrate 100. A coating failure could then occur at the side surface 100c of the substrate 100.

According to exemplary embodiments, the separation layer 150 may be formed to cover the external terminals 110 and the bottom surface 100a of the substrate 100. Thus, the possibility of an electrical short between the external terminals 110 and the conductive material overflowing onto the bottom surface 100a of the substrate 100 may be reduced and/or prevented. The conductive material may therefore be deposited to completely or desirably cover the side surface 100c of the substrate 100, and a coating defect may be prevented from occurring at the side surface 100c of the substrate 100. In addition, the separation layer 150 may protect the external terminals 110 and the bottom surface 100a of the substrate 100.

Figure 7:
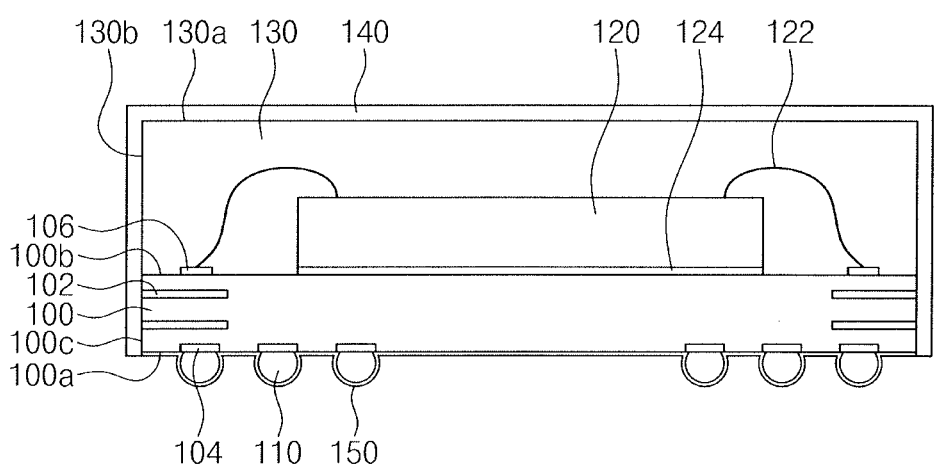

Referring to FIG. 7, the distal end portion 140a of the shield 140 formed on the separation layer 150 may be removed, and thus a semiconductor package 10 may be fabricated. For example, a cleaning process, such as acetone cleaning process or a plasma cleaning process, may be performed to remove the distal end portion 140a of the shied 140 formed on the separation layer 150. In this step, the separation layer 150 may not be removed but rather may remain on the bottom surface 100a of the substrate 100. For example, an adhesive strength between the separation layer 150 and the substrate 100 may be greater than between the separation layer 150 and the overlying distal end portion 140a of the shield 140. Therefore, during the cleaning process, the separation layer 150 may remain on the bottom surface 100a of the substrate 100, while the distal end portion 140a of the shield 140 may be removed from the separation layer 150.

In an implementation, after the shied 140 is formed, the separation layer 150 may be removed. A plasma cleaning process may be performed to remove the separation layer 150. For example, a plasma cleaning process for removing the separation layer 150 may be carried out under a condition different from that for removing the distal end portion 140a of the shield 140. In an implementation, after a plasma cleaning process is performed to remove the distal end portion 140a of the shield 140, the same plasma cleaning process may be consistently performed to remove the separation layer 150. In an implementation, the removal of the separation layer 150 may be omitted. Hereinafter, for convenience of the description, it will be described about the case that the separation layer 150 is not removed as shown in FIG. 7.

Figure 8:
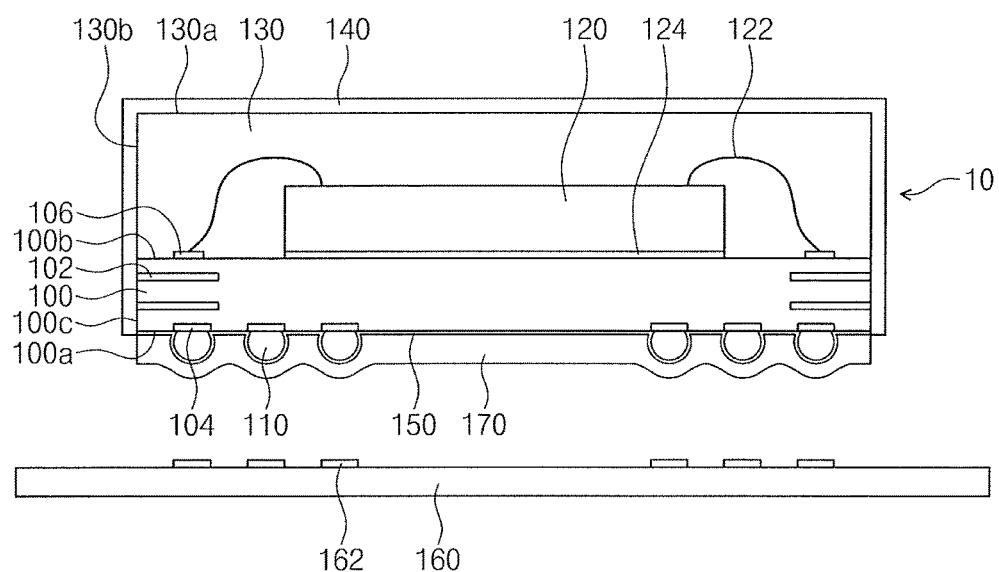
Figure 9:
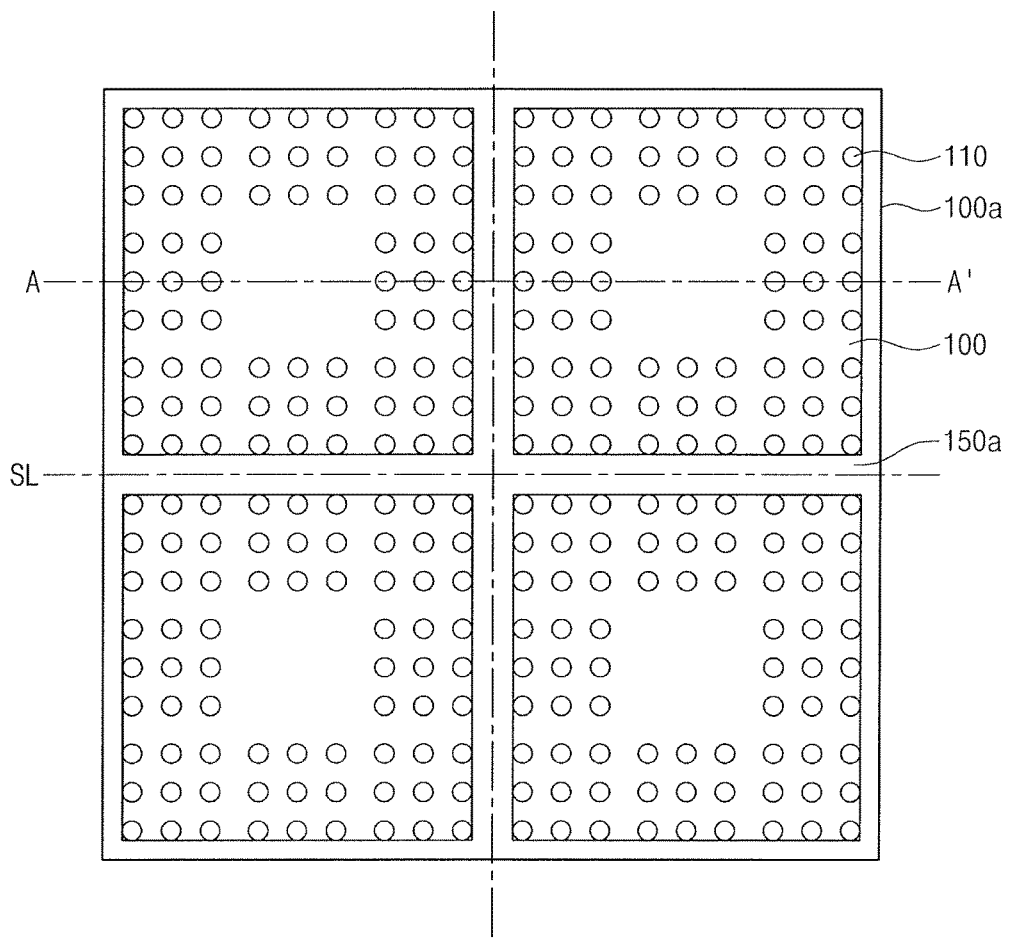
FIG. 9 illustrates a plan view showing patterning of a separation layer.

In an implementation, as shown in FIG. 8, the semiconductor package 10 may be mounted on a board 160. Referring to FIG. 8, the board 160 may be provided on the bottom surface 100a of the substrate 100. For example, the board 160 may include a memory module board. The board 160 may include board pads 162 on its top surface. A flux 170 may be provided between the bottom surface 100a of the substrate 100 and the top surface of the board 160. For example, the flux 170 may be coated on the bottom surface 100a of the substrate 100, and thus the external terminals 110 may be covered with the flux 170. In an implementation, the flux 170 may be coated on the top surface of the board 160, and thus the board pads 162 may be covered with the flux 170. The flux 170 may be coated through a printing process or a dipping process. The flux 170 may include, e.g., a resin, an activator, and a solvent. The solvent may include a glycol ether ester-bases compound, a glycol ether-based compound, an ester-based compound, a ketone-based compound, or a cyclic ester-based compound.

Thereafter, the semiconductor package 10 may be mounted on the board 160. In this step, the separation layer 150 may be removed. For example, the separation layer 150 may be dissolved in the flux 170. For example, the separation layer 150 may include a carbon fluoride, which may be soluble to an organic solvent included in the flux 170. As the separation layer 150 is dissolved, the external terminals 110 may come into contact with the board pads 162.

According to exemplary embodiments, the separation layer 150 may cover the external terminals 110 and the bottom surface 100a of the substrate 100, thereby protecting a bottom surface of the semiconductor package 10. In a subsequent mounting process of the semiconductor package 10, the separation layer 150 may be dissolved and removed in the flux 170. The separation layer 150 according to exemplary embodiments may help prevent damage to the semiconductor package 10 that might otherwise occur on its lower portion before the mounting process is performed.

In an implementation, the separation layer 150 may not cover a portion of the bottom surface 100a of the substrate 100.

Figure 10:
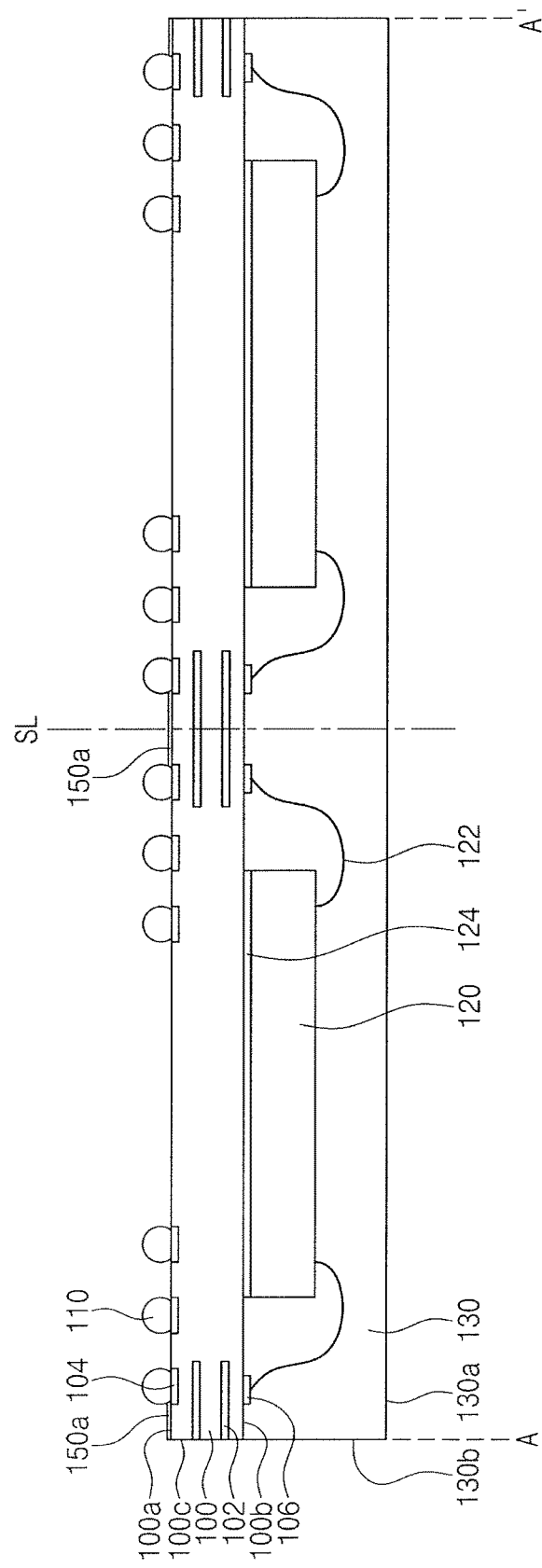
FIGS. 10 to 13 illustrate cross-sectional views of stages in a method of fabricating a semiconductor package according to exemplary embodiments.

FIG. 9 illustrates a plan view showing patterning of the separation layer. FIGS. 10 to 13 illustrate cross-sectional views of stages in a method of fabricating a semiconductor package according to exemplary embodiments. FIG. 10 illustrates a cross-sectional view taken along line A-A' of FIG. 9. Hereinafter, components the same as those discussed above are allocated the same reference numerals thereto, and a repetitive explanation thereof may be omitted or abridged for brevity of the description.

Referring to FIGS. 3 and 4, a substrate 100 may be provided. The substrate 100 may include ground patterns 102 therein. A plurality of semiconductor chips 120 may be mounted on the substrate 100. A mold layer 130 may be formed on the semiconductor chips 120. External terminals 110 may be formed below, e.g., on the bottom surface of, the substrate 100. A separation layer 150 may be coated to cover the external terminals 110 and a bottom surface 100a of the substrate 100.

Referring to FIGS. 9 and 10, the separation layer 150 may be patterned. For example, a mask pattern may be formed on the separation layer 150, and then the separation layer 150 may be partially removed by a plasma etching process using the mask pattern as an etching mask. The patterned separation layer 150a may expose the external terminals 110 and a central portion of the bottom surface 100a of the substrate 100. The patterned separation layer 150a may be superimposed on a sawing line SL while also overlapping an edge portion of the bottom surface 100a of the substrate 100. In this description, the central and edge portions of the bottom surface 100a of the substrate 100 may mean that central and edge portions of the bottom surface 100a of the substrate 100 that is singulated, or diced, after a subsequent singulation process is done.

Figure 11:
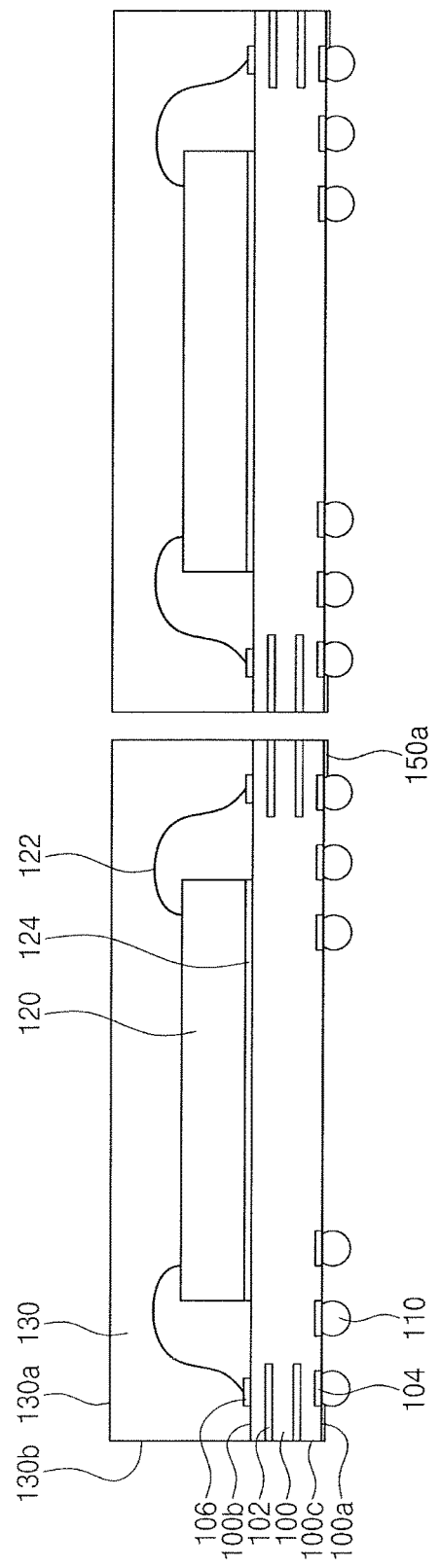

Referring to FIG. 11, the substrate 100 and the mold layer 130 may be cut to separate the semiconductor chips 120 from each other. For example, the substrate 100 and the mold layer 130 may experience a singulation process performed along the sawing line SL. The singulation process may also cut the ground patterns 102. The ground patterns 102 may be exposed through or at a side surface 100c of the cut substrate 100.

Figure 12:
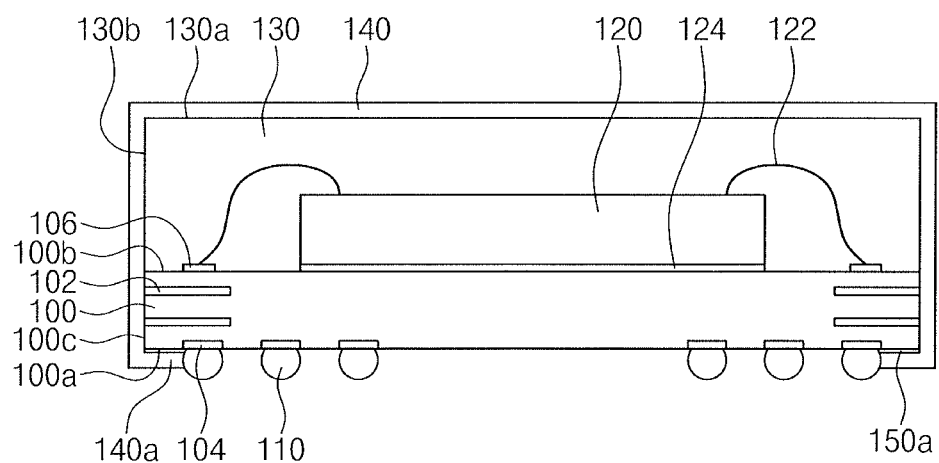

Referring to FIG. 12, a shield 140 may be formed on the mold layer 130. A conductive material may be deposited to form the shield 140. When the shield 140 is formed, the conductive material may overflow onto an edge portion of the bottom surface 100a of the substrate 100, e.g., forming a distal end portion 140a of the shield 140.

Figure 13:
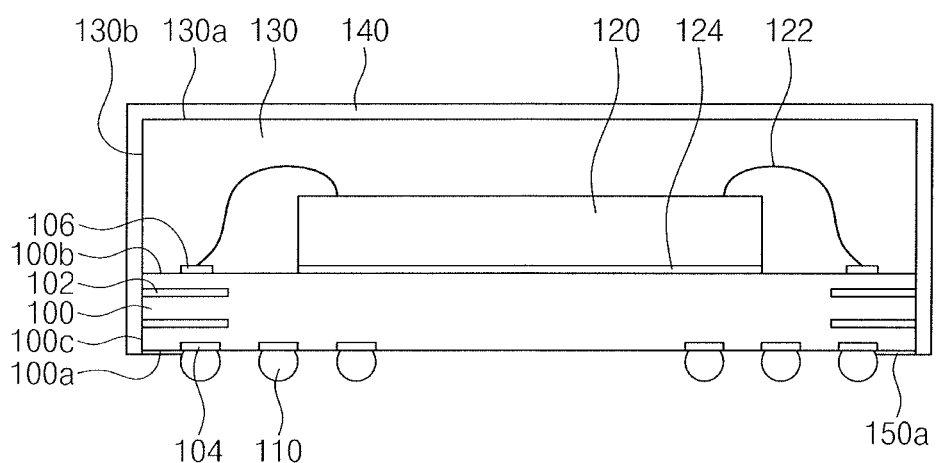

Referring to FIG. 13, the distal end portion 140a of the shield 140 may be removed, and therefore a semiconductor package 10 may be fabricated.

In some embodiments, the patterned separation layer 150a may be formed to cover the edge portion, onto which the conductive material is to overflow, of the bottom surface 100a of the substrate 100 and may not cover the external terminals 110. Accordingly, the semiconductor package 10 may be protected on its bottom surface from the overflow of the conductive material. Moreover, as the external terminals 110 are exposed through the patterned separation layer 150a, a variety of techniques may alternatively be employed to mount the semiconductor package 10 on the board 160.

In accordance with the method of fabricating a semiconductor package according to exemplary embodiments, the separation layer may be formed to, e.g., completely, cover the external terminals and the bottom surface of the substrate, and an electrical short may be prevented between the external terminals and the conductive material overflowing onto the bottom surface of the substrate. In addition, the conductive material may be deposited to, e.g., completely, cover the side surface of the substrate, and thus it may be possible to prevent a coating defect occurred on the side surface of the substrate. Furthermore, the separation layer may cover to protect the external terminals and the bottom surface of the substrate.

By way of summation and review, electric waves emitted from some semiconductor packages may affect or cause problems to other semiconductor packages mounted therearound. An electromagnetic field may be created around a data signal line in accordance with current flow, and the electromagnetic field may also affect signals transmitting through adjacent signal lines. As a result, an electromagnetic interference (EMI) phenomenon disturbing normal operation of components may be induced. The electromagnetic interference (EMI) could cause weakness of circuit function, malfunction, operation abnormality, operation failure, et cetera in electronic products. For example, the electromagnetic interference may be severe when signal lines transmit high frequency signal for high speed operation.

According to exemplary embodiments, the semiconductor package may be formed to protect its bottom surface by covering the external terminals and the bottom surface of the substrate. The separation layer may be dissolved and removed in the flux in a subsequent mounting process of the semiconductor package. As such, the separation layer may help reduce or prevent damage to the semiconductor package that could possibly occur on its lower portion before the mounting of the semiconductor package.

The embodiments may provide a semiconductor package and a method of fabricating the same including an electromagnetic interference (EMI) shield.

The embodiments may provide a method of fabricating a semiconductor package capable of preventing damage to external terminals and a bottom surface of a substrate when an electromagnetic interference shield is formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor package, the method comprising:
   mounting semiconductor chips on a substrate;
   forming a mold layer that covers the semiconductor chips on the substrate;
   forming external terminals on a bottom surface of the substrate;
   forming a separation layer on the external terminals and the bottom surface of the substrate;
   cutting the substrate and the mold layer to separate the semiconductor chips from each other; and
   forming a shield surrounding the mold layer and a side surface of the substrate,
   wherein forming the shield includes:
   providing a conductive material on the mold layer, on the side surface of the substrate, and on the separation layer; and
   performing a cleaning process to remove the conductive material from the separation layer.

2. The method as claimed in claim 1, wherein removing the conductive material from the separation layer includes performing an acetone cleaning process or a plasma cleaning process.

3. The method as claimed in claim 1, further comprising, before cutting the substrate and the mold layer, patterning the separation layer to expose the external terminals and a central portion of the bottom surface of the substrate.

4. The method as claimed in claim 1, wherein forming the separation layer includes performing an organic layer coating process including a plasma coating process or a spray coating process.

5. The method as claimed in claim 1, wherein the separation layer includes a carbon fluoride.

6. The method as claimed in claim 1, further comprising removing the separation layer after forming the shield.

7. The method as claimed in claim 1, further comprising, after forming the shield,
   providing a board on the external terminals;
   providing a flux between the external terminals and the board; and
   connecting the external terminals to the board,
   wherein the separation layer is dissolved in the flux.

8. A semiconductor package, comprising: a substrate including an external terminal on a bottom surface thereof; a semiconductor chip mounted on a top surface of the substrate; a mold layer covering the semiconductor chip and the top surface of the substrate; a shield covering a top surface of the mold layer, a side surface of the mold layer, and a side surface of the substrate; and a separation layer on the bottom surface of the substrate wherein the shield has a bottom surface that is coplanar with a bottom surface of the separation layer; the separation layer overlaps an edge portion of the bottom surface of the substrate, and the external terminal and a central portion of the bottom surface of the substrate are exposed.

9. The semiconductor package as claimed in claim 8, wherein the separation layer overlaps the external terminal and the bottom surface of the substrate.

10. The semiconductor package as claimed in claim 8, wherein the separation layer includes a carbon fluoride.

11. The semiconductor package as claimed in claim 8, wherein:
    the substrate further includes a ground pattern therein, and
    the shield is electrically connected to the ground pattern.

12. A method of fabricating a semiconductor package, the method comprising:
    mounting a semiconductor chip on a substrate;
    forming a mold layer that covers the semiconductor chip on the substrate;
    forming external terminals on a bottom surface of the substrate;
    forming a separation layer on an outer edge of the bottom surface of the substrate; and
    forming an electromagnetic interference shield such that the electromagnetic interference shield covers the mold layer and a side surface of the substrate,
    wherein forming the electromagnetic interference shield includes:

providing a conductive material on the mold layer, on the side surface of the substrate, and on the separation layer at the outer edge of the bottom surface of the substrate; and performing a cleaning process to selectively remove the conductive material from the separation layer at the outer edge of the bottom surface of the substrate.

13. The method as claimed in claim 12, wherein the cleaning process includes an acetone cleaning process or a plasma cleaning process.

14. The method as claimed in claim 12, further comprising removing the separation layer after forming the electromagnetic interference shield.

* * * * *